United States Patent
Beer et al.

(10) Patent No.: US 9,496,237 B2
(45) Date of Patent: Nov. 15, 2016

(54) SEMICONDUCTOR DEVICE HAVING SOLDERABLE AND BONDABLE ELECTRICAL CONTACT PADS

(71) Applicant: Infineon Technologies AG, Neubiberg (DE)

(72) Inventors: Gottfried Beer, Nittendorf (DE); Raimund Foerg, Straubing (DE); Juergen Hoegerl, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/715,778

(22) Filed: May 19, 2015

(65) Prior Publication Data
US 2015/0333023 A1    Nov. 19, 2015

(30) Foreign Application Priority Data
May 19, 2014   (DE) .................. 10 2014 107 018

(51) Int. Cl.
*H01L 23/00* (2006.01)
*H01L 23/522* (2006.01)
*H01L 23/48* (2006.01)

(52) U.S. Cl.
CPC ............... *H01L 24/14* (2013.01); *H01L 24/03* (2013.01); *H01L 24/05* (2013.01); *H01L 24/06* (2013.01); *H01L 24/11* (2013.01); *H01L 24/13* (2013.01); *H01L 23/481* (2013.01); *H01L 23/5226* (2013.01); *H01L 24/16* (2013.01); *H01L 24/32* (2013.01); *H01L 24/45* (2013.01); *H01L 24/48* (2013.01); *H01L 2224/039* (2013.01); *H01L 2224/0345* (2013.01); *H01L 2224/0347* (2013.01); *H01L 2224/0381* (2013.01); *H01L 2224/03462* (2013.01); *H01L 2224/03614* (2013.01); *H01L 2224/03912* (2013.01); *H01L 2224/03914* (2013.01); *H01L 2224/0401* (2013.01); *H01L 2224/04042* (2013.01);
(Continued)

(58) Field of Classification Search
CPC ..................... H01L 24/28; H01L 24/17; H01L 24/06; H01L 2924/01079; H01L 2924/01046; H01L 24/81; H01L 21/76877; H01L 21/76802; H01L 23/5226; H01L 23/345; H01L 23/481; H01L 23/488; H01L 24/27; H01L 24/11; H01L 24/48; H01L 24/82; H01L 24/03; H01L 24/09
See application file for complete search history.

(56) References Cited

U.S. PATENT DOCUMENTS

| | | |
|---|---|---|
| 6,335,104 B1 | 1/2002 | Sambucetti et al. |
| 7,665,652 B2 | 2/2010 | Mis et al. |
(Continued)

FOREIGN PATENT DOCUMENTS

DE       19741436 A1    12/1998

*Primary Examiner* — Alonzo Chambliss
(74) *Attorney, Agent, or Firm* — Murphy, Bilak & Homiller, PLLC

(57) ABSTRACT

A semiconductor device includes a semiconductor chip and a plurality of electrical contact pads disposed on a main face of the semiconductor chip, wherein the electrical contact pads each include a layer stack, each layer stack having one and the same order of layers, and wherein the electrical contact pads are both solderable and bondable.

20 Claims, 6 Drawing Sheets

(52) U.S. Cl.
CPC ............... *H01L 2224/04073* (2013.01); *H01L 2224/05073* (2013.01); *H01L 2224/05082* (2013.01); *H01L 2224/05083* (2013.01); *H01L 2224/05155* (2013.01); *H01L 2224/05164* (2013.01); *H01L 2224/05166* (2013.01); *H01L 2224/05184* (2013.01); *H01L 2224/05552* (2013.01); *H01L 2224/05555* (2013.01); *H01L 2224/05562* (2013.01); *H01L 2224/05564* (2013.01); *H01L 2224/05582* (2013.01); *H01L 2224/05644* (2013.01); *H01L 2224/05647* (2013.01); *H01L 2224/0603* (2013.01); *H01L 2224/06051* (2013.01); *H01L 2224/06131* (2013.01); *H01L 2224/06132* (2013.01); *H01L 2224/06133* (2013.01); *H01L 2224/06135* (2013.01); *H01L 2224/06136* (2013.01); *H01L 2224/06177* (2013.01); *H01L 2224/119* (2013.01); *H01L 2224/1147* (2013.01); *H01L 2224/11462* (2013.01); *H01L 2224/11464* (2013.01); *H01L 2224/11825* (2013.01); *H01L 2224/13012* (2013.01); *H01L 2224/13014* (2013.01); *H01L 2224/13022* (2013.01); *H01L 2224/13082* (2013.01); *H01L 2224/13083* (2013.01); *H01L 2224/13111* (2013.01); *H01L 2224/13144* (2013.01); *H01L 2224/13155* (2013.01); *H01L 2224/13164* (2013.01); *H01L 2224/13562* (2013.01); *H01L 2224/13644* (2013.01); *H01L 2224/1403* (2013.01); *H01L 2224/14051* (2013.01); *H01L 2224/14131* (2013.01); *H01L 2224/14132* (2013.01); *H01L 2224/14133* (2013.01); *H01L 2224/14135* (2013.01); *H01L 2224/14136* (2013.01); *H01L 2224/14177* (2013.01); *H01L 2224/16145* (2013.01); *H01L 2224/26145* (2013.01); *H01L 2224/32145* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48227* (2013.01); *H01L 2224/48472* (2013.01); *H01L 2224/73204* (2013.01); *H01L 2224/73207* (2013.01); *H01L 2224/81191* (2013.01); *H01L 2224/81193* (2013.01); *H01L 2924/13055* (2013.01)

(56) References Cited

U.S. PATENT DOCUMENTS

| 2005/0040529 | A1  | 2/2005  | Lee      |              |
|--------------|-----|---------|----------|--------------|
| 2008/0150161 | A1* | 6/2008  | Lin      | H01L 24/10   |
|              |     |         |          | 257/778      |
| 2012/0248614 | A1* | 10/2012 | Gandhi   | H01L 23/49811 |
|              |     |         |          | 257/762      |
| 2012/0256312 | A1* | 10/2012 | Tsujimoto | H01L 24/05  |
|              |     |         |          | 257/737      |
| 2013/0062757 | A1* | 3/2013  | Feger    | H01L 23/544  |
|              |     |         |          | 257/737      |

* cited by examiner

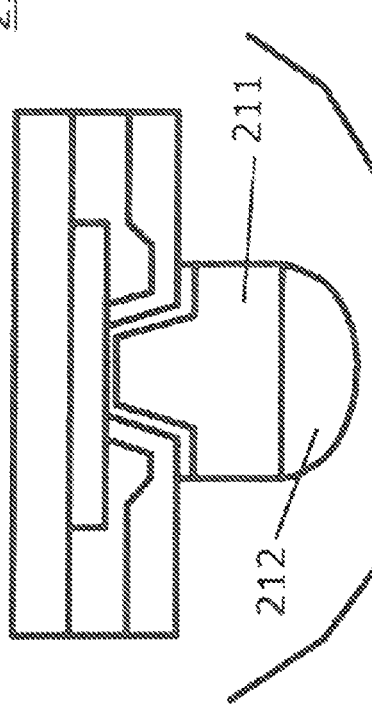
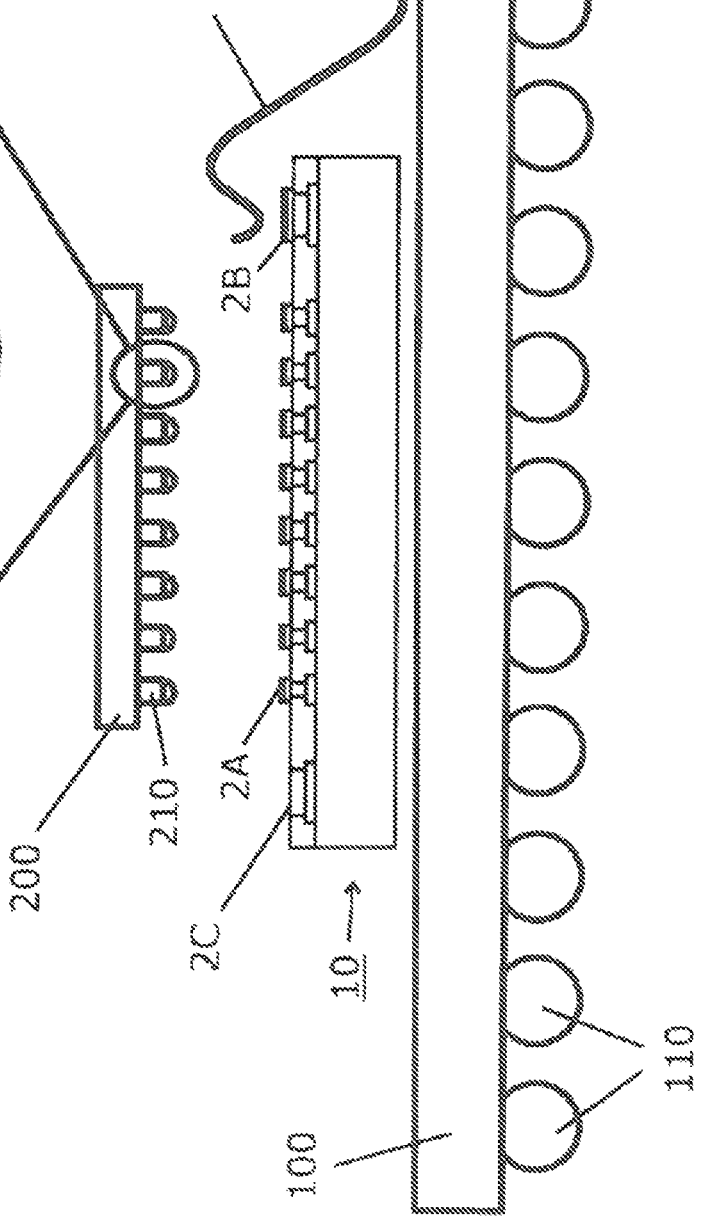

SEMICONDUCTOR DEVICE HAVING SOLDERABLE AND BONDABLE ELECTRICAL CONTACT PADS

PRIORITY CLAIM

This application claims priority to German Patent Application No. 10 2014 107 018.6 filed on 19 May 2014, the content of said application incorporated herein by reference in its entirety.

TECHNICAL FIELD

The present invention relates to a semiconductor device and to a method for fabricating a semiconductor device.

BACKGROUND

A semiconductor device may be comprised of a semiconductor chip having contact elements in the form of contact pads on only one main surface or on both main surfaces thereof. In general, the contact pads can be used in different ways for electrically connecting the semiconductor chip to either a substrate like, for example, a printed circuit board, or to another semiconductor chip. For this purpose, different sorts of layer stacks have been proposed in the art which are to be applied on contact pads as fabricated in the back end of line (BEOL) process of the semiconductor chip fabrication process. The layer stacks as proposed so far are only suited for either one soldering or wire bonding.

SUMMARY

A semiconductor device is disclosed. According to an embodiment, the semiconductor device includes a semiconductor chip, and a plurality of electrical contact pads disposed on a main face of the semiconductor chip. The electrical contact pads or one or more groups of the electrical contact pads include a top layer stack, each top layer stack including one and the same order of layers. The electrical contact pads are both solderable and bondable.

According to another embodiment, the semiconductor device includes a semiconductor chip, and a plurality of electrical contact pads disposed on a main face of the semiconductor chip. The electrical contact pads or one or more groups of the electrical contact pads include a layer stack, each layer stack including a first lower Ni-based layer, and a second upper Au-based layer.

A method for fabricating a semiconductor device is disclosed. According to an embodiment, the method includes providing a semiconductor die, fabricating a plurality of electrical contact pads on a main face of the semiconductor die. The electrical contact pads or one or more groups of the electrical contact pads include a layer stack, each layer stack including one and the same order of layers. The electrical contact pads are both solderable and wire bondable.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 5A and 5B show a schematic cross-sectional side view representation for illustrating an exemplary fabrication of a chip-to-chip stack to be attached onto a substrate in FIG. 5A and a schematic cross-sectional side view representation of an enlarged section showing solderable pillar pads of the upper semiconductor device in FIG. 5B.

DETAILED DESCRIPTION

Figure 1:
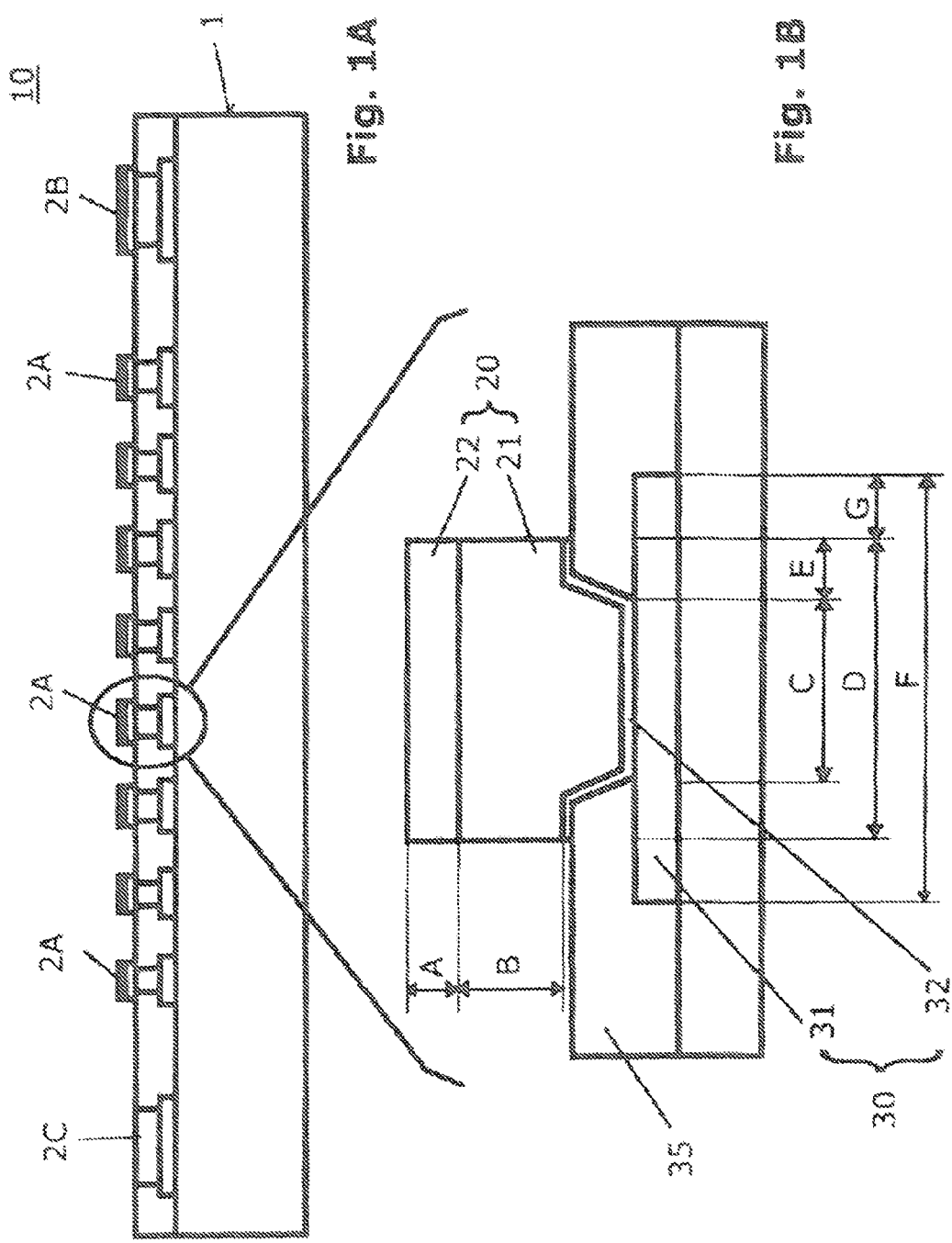
FIGS. 1A and 1B show a schematic cross-sectional side view representation of a semiconductor device including solderable and bondable electrical contact pads according to FIG. 1A and an enlarged schematic cross-sectional side view representation of one of the electrical contact pads according to FIG. 1B.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a semiconductor device and a method for fabricating a semiconductor device may use various types of semiconductor chips or circuits incorporated in the semiconductor chips, among them logic integrated circuits, volatile memory devices, non-volatile memory devices, analogue integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor or other structures or devices in which at least one electrical contact pad is arranged on a first main face of the semiconductor chip and at least one other electrical contact pad is arranged on a second main face of the semiconductor chip opposite to the first main face of the semiconductor chip.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor chip. The contact elements or contact pads can in principle be made from any electrically conducting material, e.g., from a metal as aluminum, gold, or copper, for example, or a metal alloy, or an electrically conducting organic material, or an electrically conducting semiconductor material. In the examples shown and illustrated further below a specific layer stack will be proposed as one example of a layer stack capable of providing a solderable and bondable, e.g. wire bondable, electrical contact pad.

In the claims and in the following description different embodiments of a method for fabricating a semiconductor device are described as a particular sequence of processes or measures, in particular in the flow diagram. It is to be noted that the embodiments should not be limited to the particular sequence described. Particular ones or all of different processes or measures can also be conducted simultaneously or in any other useful and appropriate sequence.

Referring to FIGS. 1A and 1B, a schematic cross-sectional side view representation of a semiconductor device according to a first aspect is shown in FIG. 1A and an enlarged schematic cross-sectional side view representation of one of the electrical contact pads is shown in FIG. 1B. The semiconductor device 10 of the first aspect as shown in FIG. 1A includes a semiconductor chip 1 and a plurality of electrical contact pads 2A, 2B and 2C disposed on a main face of the semiconductor chip 1. The electrical contact pads 2A and 2B each include a top layer stack 20, wherein each layer stack 20 includes one and the same order of layers, and wherein the electrical contact pads 2A and 2B are both solderable and bondable. In the representation of FIG. 1A, the electrical contact pads 2A are those intended for a soldering process and the electrical contact pads 2B are those intended for a wire bonding process. The electrical contact pads 2C do not have such additional layer stack and are shown here only for illustration purposes. The contact pads 2C are contact pads as fabricated in the BEOL process.

In semiconductor processing the chip-to-chip connections become more and more important as they are capable to provide a high bandwidth at very low parasitic effects. The process of stacking two semiconductor chips in a face-to-face configuration requires solderable electrical contact pads on the semiconductor chips. In most cases, however, also bondable electrical contact pads are required on the lower semiconductor chip for providing wire bond connections to a substrate, e.g., a printed circuit board (PCB) or to a further semiconductor chip or to elsewhere. The fabrication of two different layer stacks, one of which is solderable and the other one of which is bondable, requires an elaborate and costly processing. The above proposed semiconductor device, however, provides an efficient solution in that all of a plurality of electrical contact pads are configured so that they are both solderable and bondable. They might be fabricated during one and the same fabrication steps so that they comprise a layer stack of one and the same materials and one and the same order of layers. The thicknesses of the layers might also be identical between the plurality of electrical contact pads, whereas the lateral sizes of the electrical contact pads might be different so that chip-to-chip connections as well as chip-to-wire bond connections can be fabricated properly.

According to an example of the semiconductor device 10, the electrical contact pads are configured such that they are bondable with respect to only one particular wire bond material like, for example, Cu, Au, Al, Ag, or alloys between one or more of these materials. The electrical contact pads can also be configured such that they are bondable with respect to wire bonds of more than one or even all of the afore-mentioned materials.

According to an example of the semiconductor device 10, each top layer stack 20 comprises a first lower Ni-based layer 21 and a second upper Au-based layer 22. According to a further example, each top layer stack 20 may further include a third Pd-based layer disposed between the first and second layers 21 and 22. According to a further example, the first lower Ni-based layer 21 contains P wherein the amount of P can be in a range from greater than 0% to less or equal than 12%, more specifically between 3% and 10%, more specifically between 5% and 8%.

According to an example, the layers of the top layer stack are deposited by galvanic plating or by electroless plating.

According to an example, the first lower Ni-based layer has a thickness in a range from 1 μm-10 μm, more specifically from 4 μm-7 μm. The second upper Au-based layer may comprise a thickness in a range from 0.1 μm-0.7 μm, more specifically from 0.3 μm-0.5 μm. In case of a third Pd-based layer disposed between the first and second layers, the third layer may comprise a thickness in a range from 0.03 μm-0.3 μm, more specifically from 0.1 μm-0.25 μm.

According to an example of the semiconductor device 10, the top layer stack 20 may be disposed above a back end of line (BEOL) pad layer 31. The BEOL is the second portion of semiconductor die fabrication on wafer level where the individual devices like, for example, transistors, capacitors, resistors, etc., get interconnected with wiring on the wafer. The BEOL includes contact pads, insulating layers like dielectrics, and metallization planes. The BEOL layer stack 30 may comprise a first lower BEOL layer 31 which may be based on Cu or Al or an alloy thereof, or either one thereof together with one or more additives like Si. The first BEOL layer 31 may be disposed on a metallic contact which may be connected to a further metallization layer in a plane further below. The first BEOL layer 31 may further be partly embedded into an insulating layer 35 based on, for example, a dielectric material. An opening may be formed into the insulation layer 35 above the first BEOL layer 31 and the second BEOL layer 32 may be deposited on the walls of the opening. The second BEOL layer 32 may be applied to protect the first layer 31 especially if layer 31 consists of an environment and/or oxidation sensitive layer. The second BEOL layer 32 may have been used in the fabrication process as a seed layer for the subsequent galvanic plating of the top layer stack. The seed layer 32 may also comprise a first Ti or TiW based layer and a second Cu based layer on top of the first layer. An example thereof will be described further below in connection with FIG. 3A-H.

According to an example of the semiconductor device, it is also possible that the BEOL pad only comprises one metallic layer, in particular a Cu based layer so that the top layer stack is deposited on top of this BEOL pad layer. An example thereof will be described further below in connection with FIG. 4A-E.

According to an example of the semiconductor device 10, the layer stack 20 and the BEOL layer stack 30 may comprise one or more of the following geometrical conditions. The layer stack 20 and the BEOL layer stack 30 may have e.g. a circular or polygonal, e.g. octagonal, opening in a top view according to FIG. 1. In FIG. 1B, the thickness of the second upper Au-based layer 22 is denoted as A, the thickness of the first lower Ni-based layer 21 from the upper main face down to the upper face of the material layer 35 is denoted as B, the horizontal diameter of the bottom of the second BEOL layer 32 is denoted as C, the horizontal diameter of the layer stack 20, i.e., the first and second layers 21 and 22, is denoted as D, the one-sided lateral width of the inclined section and the top overlap section of the second BEOL layer 32 is denoted as E, the horizontal diameter of the first BEOL layer 31 is denoted as F, and the lateral one-sided overlap of the horizontal diameter of the first BEOL layer 31 with respect to the horizontal diameter of the layer stack 20 is denoted as G. Thus, it can easily be seen from FIG. 1B, that, for example, A is less than B, and F is in this case greater than D. The insulation layer 35 does not have to completely cover the complete area between the pad edges, i.e., dimension F, and the metal stack, i.e., dimension C, which means that D=C is also possible. The lateral diameter F of the layer stack 20 can be in a range from 10 μm to 80 μm. The lateral distance between adjacent layer stacks 20 as shown in FIG. 1A can be in a range from 10 μm to 150 μm, more specifically from 30 μm to 70 μm.

According to an example of the semiconductor device 10, the plurality of electrical contact pads can be divided into a first group and a second group. The first group of electrical contact pads may have first lateral dimensions and the second group of electrical contact pads may have second lateral dimensions, wherein the first lateral dimensions are smaller than the second lateral dimensions. Such a configuration might occur especially in cases in which the first group of electrical contact pads are intended to make contact with electrical contact pads of another semiconductor chip and the second group of electrical contact pads are intended to be connected with bond wires. The second group of electrical contact pads may be located adjacent to an edge portion of the main face of the semiconductor chip. The first group of electrical contact pads may be located in an area covering a center point of the main face of the semiconductor chip. Furthermore, a dam may be disposed on the main face in such a way that it spatially separates the first and second groups of electrical contact pads from each other. The dam may have the form of a ring surrounding the first group of electrical contact pads wherein the ring can have a closed form. The dam may be formed either of one or more of the materials of the layer stack 20 or of a polymer material. It is also possible that the first group of electrical contact pads differs from the second group of electrical contact pads in one or more of shape and lateral dimensions. More specifically, it can be the case that the lateral dimensions are similar but the shape is different, i.e. the electrical contact pads of the contact pads have circular cross sections and the electrical contact pads of the second group have quadratic or rectangular cross section.

According to an example, the first group of electrical contact pads comprises layer stacks, respectively, having first lateral dimensions in a range from 5 μm-50 μm. The second group of electrical contact pads comprises layer stacks, respectively, which may comprise lateral dimensions in a range from 40 μm-100 μm.

According to an example of the semiconductor device 10, the first group of electrical contact pads may comprise layer stacks having circular or polygonal, e.g., octagonal, top view and the second group of electrical contact pads may comprise layer stacks having rectangular or quadratic top view.

According to an example of the semiconductor device 10, the first group of electrical contact pads is intended to be solder connected to electrical contact elements of a further semiconductor chip, and the second group of electrical contact pads is intended to be connected with wire bonds so that connections between the semiconductor device and another device like, for example, a substrate, can be provided.

According to an example of the semiconductor device 10, the number of electrical contact pads of the first group is in a range from 500 to 20000.

According to an example, the semiconductor device 10 may further comprise a further semiconductor chip comprising electrical contact elements and being disposed above the semiconductor chip 1, wherein the electrical contact elements are connected with a group of the plurality of electrical contact pads, in particular with the first group of electrical contact pads of the semiconductor device 10.

The present disclosure is also related to a semiconductor device according to a second aspect. The semiconductor device according to the second aspect comprises a semiconductor chip and a plurality of electrical contact pads disposed on a main face of the semiconductor chip, wherein the electrical contact pads each comprise a top layer stack, each top layer stack comprising a first lower Ni-based layer, and a second upper Au-based layer. Further examples and embodiments of the semiconductor device according to the second aspect can be formed along the lines of the embodiments and examples as were described above in connection with the semiconductor device according to the first aspect and also those embodiments and examples which will be described in the following.

Figure 2:
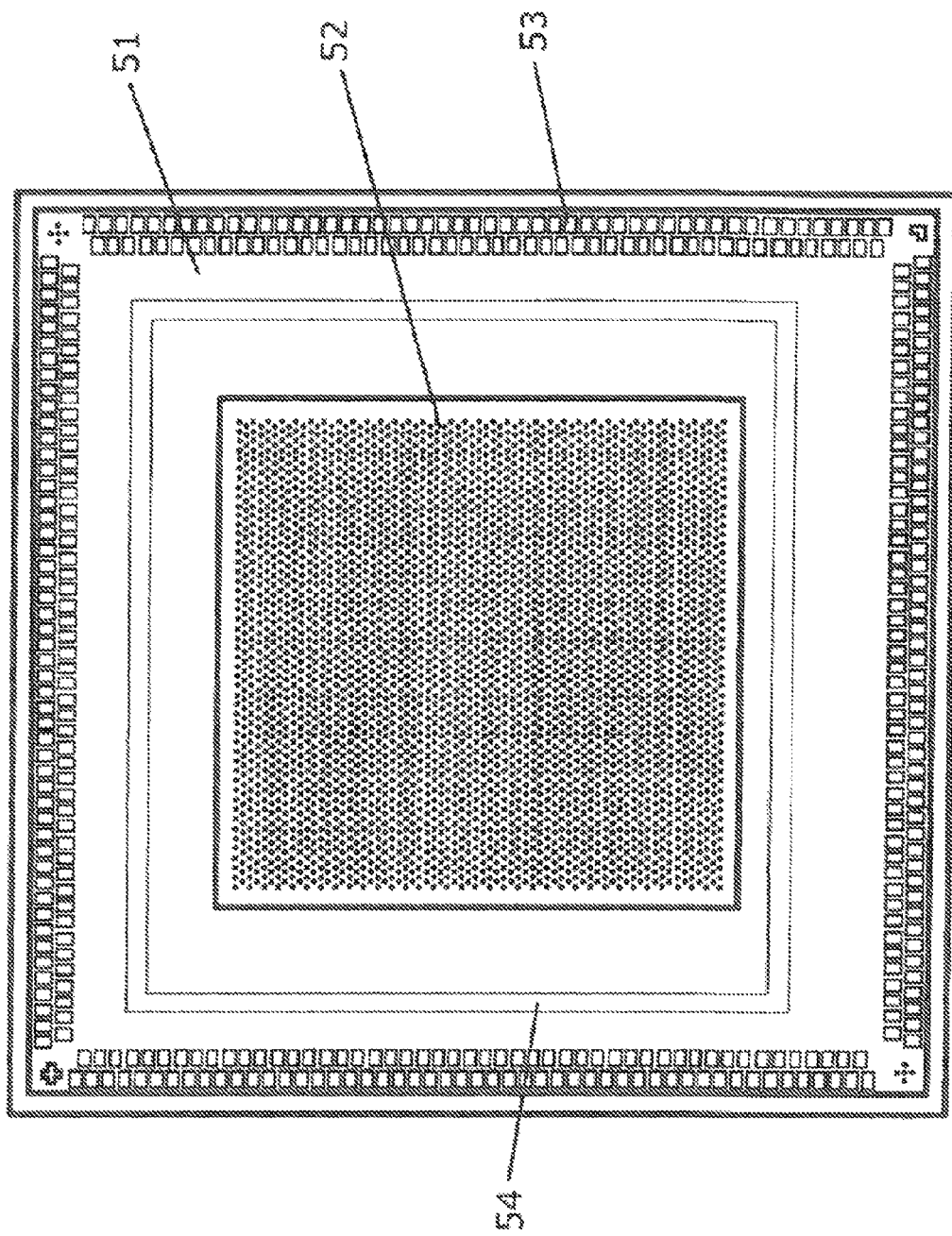
FIG. 2 shows a schematic top view representation of a semiconductor device according to an example comprising solder pads and wire bond pads separated from each other by a dam.

Referring to FIG. 2 there is shown a top view representation of a semiconductor device, according to an example. The semiconductor device 50, as shown in FIG. 2, includes a semiconductor chip 51 and a plurality of electrical contact pads 52 and 53 disposed on a main face of the semiconductor chip 51. The electrical contact pads 52 and 53 may each comprise a top layer stack such as that shown in FIGS. 1A, and 1B and described in detail in the description above. The electrical contact pads 52 and 53 correspond to a first group of electrical contact pads 52 and a second group of electrical contact pads 53. The first group 52 of electrical contact pads may be arranged in an area around a center point of the main face of the semiconductor chip 51, more specifically over a quadratic area which is point symmetric to the center point of the main face. The first group 52 may comprise electrical contact pads having layer stacks of circular top view or cross-section. The second group 53 of electrical contact pads may be arranged along side edges of the main face of the semiconductor chip 51. The electrical contact pads of the second group 53 may comprise layer stacks having rectangular or quadratic top view or cross section.

The first group 52 of electrical contact pads may be intended to make contact with electrical contact elements of a further semiconductor chip which should be connected to the semiconductor chip 51 in a flip-chip configuration resulting in a face-to-face connection of the two semiconductor chips. The first group 52 of electrical contact pads may be virtually arranged in a matrix array, hexagonal array or an irregular arrangement and may have different top view sections in diameter and/or shape. The second group 53 of electrical contact pads may be intended to be connected with wire bonds to make connections to a printed circuit board (PCB) or to other devices.

The first and second groups 52 and 53 of electrical contact pads may be spatially separated from each other. As shown in FIG. 2 they may also be separated from each other by a dam 54 which in the present case has the form of a closed ring. The purpose of the dam 54 is to avoid bleeding and therefore contaminations of the second group 53 during the bonding process and/or underfilling process of first group 52, which are used to fill the volume between the solder top and bottom die. "Closed ring" in this embodiment means that allowable interruptions of the ring are still small enough to prevent a flow out of such underfilling material contaminating the second group 53.

Referring to FIGS. 3A-H, there are shown schematic cross-sectional side view representations to illustrate a method for fabricating a semiconductor device by galvanic plating.

Figure 3A:
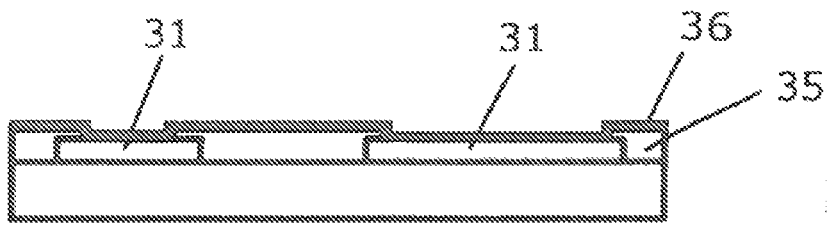
FIGS. 3A-H show schematic cross-sectional side view representations for illustrating a method for fabricating a semiconductor device, the method employing galvanic plating, according to an embodiment.
Figure 3B:
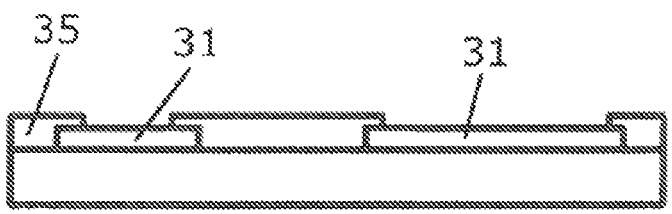
Figure 3C:
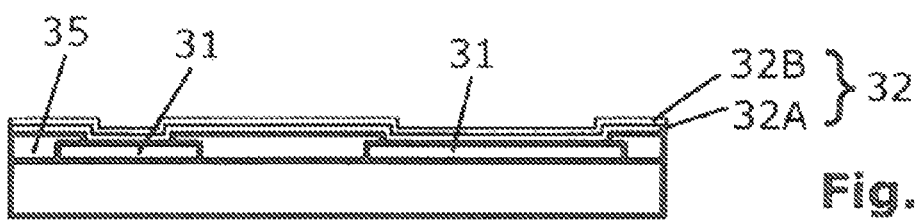
Figure 3D:
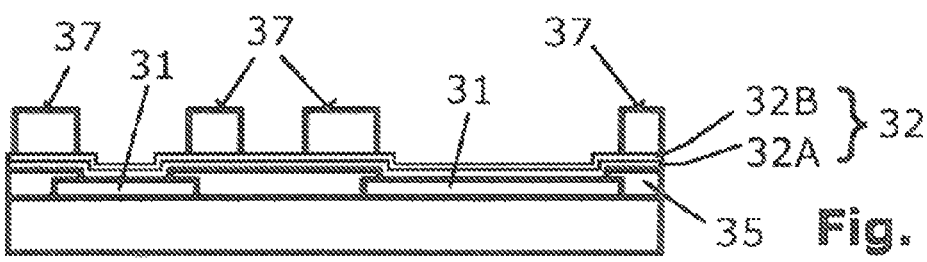
Figure 3E:
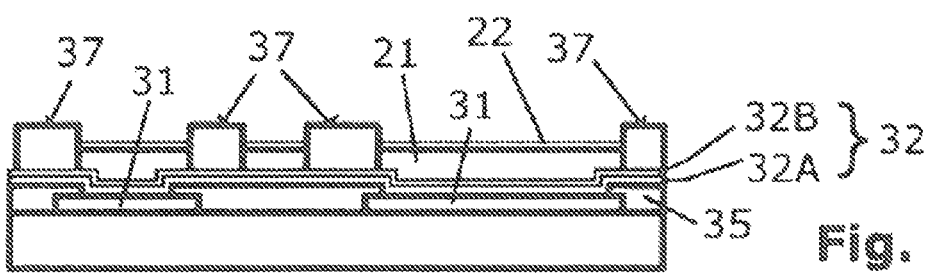
Figure 3F:
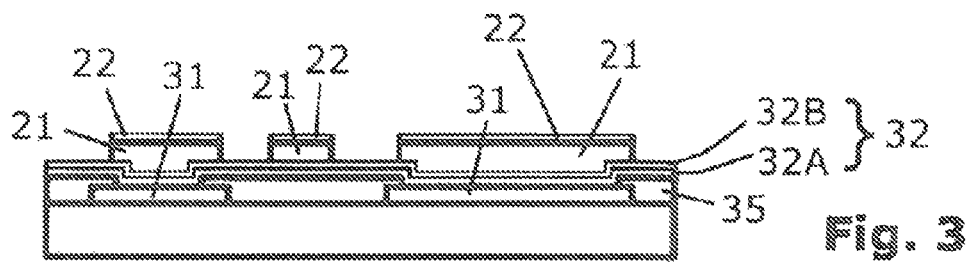
Figure 3G:
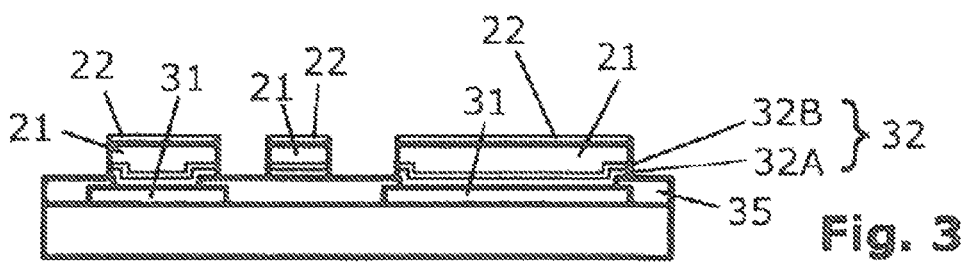

FIG. 3A indicates a processed semiconductor wafer wherein a cross section vertical to the main surface is shown comprising two lateral BEOL (Cu—) pad layers 31 embedded in an insulation layer 35 which has openings above the (Cu—) pad layers 31. FIG. 3B shows the same after a surface pre-treatment for removing a very thin oxide layer 36 by, for example, a plasma treatment. FIG. 3C shows the same after depositing a seed layer 32 by, for example, sputtering (or physical vapor deposition, PVD) wherein the seed layer 32 may include a WTi based layer 32A with an optional Cu based layer 32B on top. FIG. 3D shows the same according to a so called semiadditive processing after applying a structured resist layer 37 onto portions which should be masked. The resist layer 37 can at first be deposited onto the entire main face by spinning, lamination, printing, or any other technology, afterwards the resist layer 37 can be cured, afterwards the resist layer 37 can be exposed to light and then developed. FIG. 3E shows the same after performing a galvanic plating process wherein the galvanic plating of a first lower Ni-based layer 21 and a second upper Au-based layer 22 is shown. Optionally, a third Pd-based layer can be galvanically plated and disposed between the first and second layers 21 and 22. FIG. 3F shows the same after removing the resist layer 37 by, for example, stripping. FIG. 3G shows the same after removing the seed layer 32 outside the plated regions by, for example, etching. In case of an upper Cu seed layer 32B an etch medium $H_3PO_4/H_2O_2$ can be used and for the lower WTi seed layer 32A an etch medium $H_2O_2$ can be used. Thereafter a cleaning with a plasma, in particular an HF plasma, can be performed and finally a final visual inspection may be done. It may further be possible to apply an additional layer between the seed layer and the Ni-based layer 21. Furthermore to apply such structure in a so called subtractive processing.

Figure 3H:
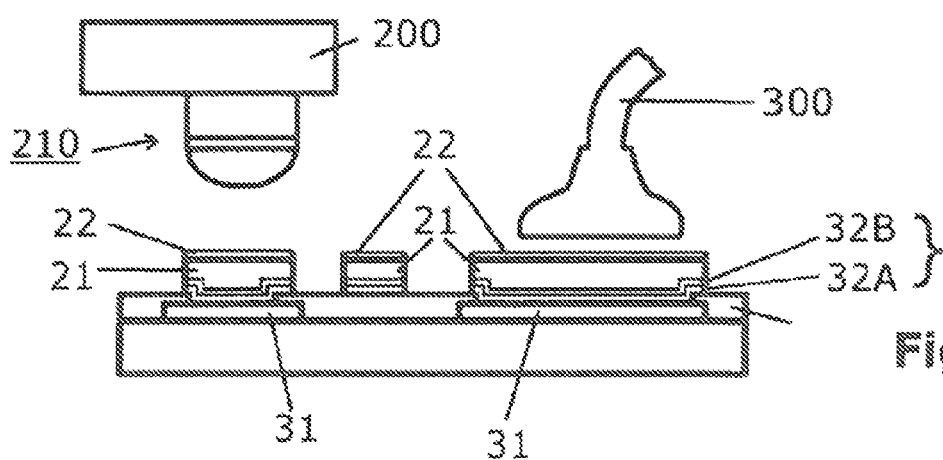

FIG. 3H shows a possible application in which the left-sided smaller layer stack of group 52 can be used to be connected with an electrical contact element 210 of an upper semiconductor device 210 and the right-sided larger layer stack of the group 53 can be used to be connected with a wire bond, e.g. Cu-, Au-, or A-wire. The center layer stack will be formed in such a way that it may serve as a dam such as that shown with reference sign 54 in FIG. 2.

FIGS. 4A-F show schematic cross-sectional side view representations for illustrating a method for fabricating a semiconductor device by electroless plating.

Figure 4A:
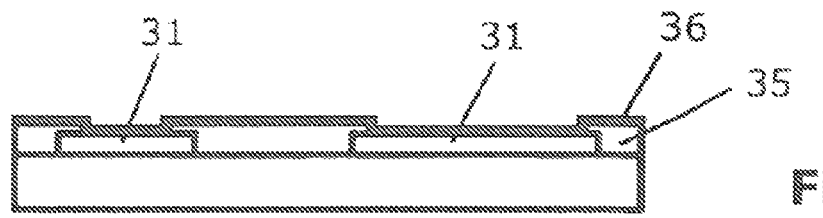
FIGS. 4A-E show schematic cross-sectional side view representations for illustrating a method for fabricating a semiconductor device, the method employing electroless plating, according to an embodiment.
Figure 4B:
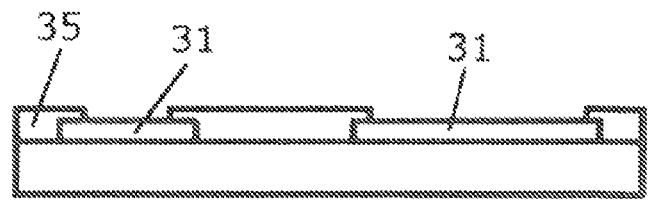
Figure 4C:
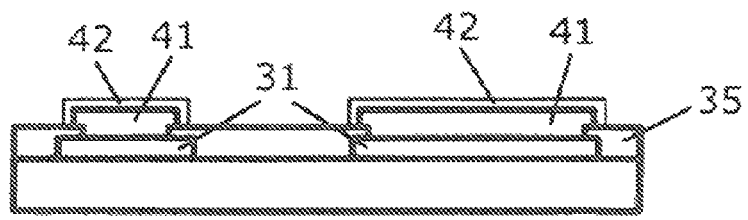
Figure 4D:
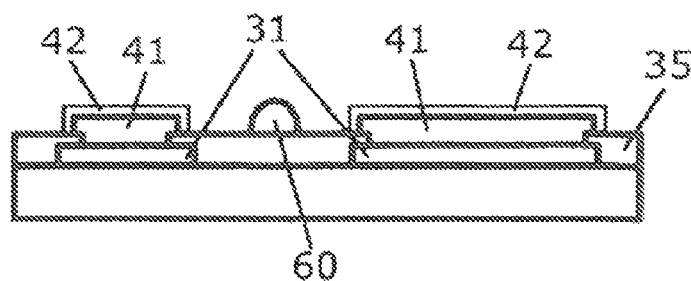
Figure 4E:
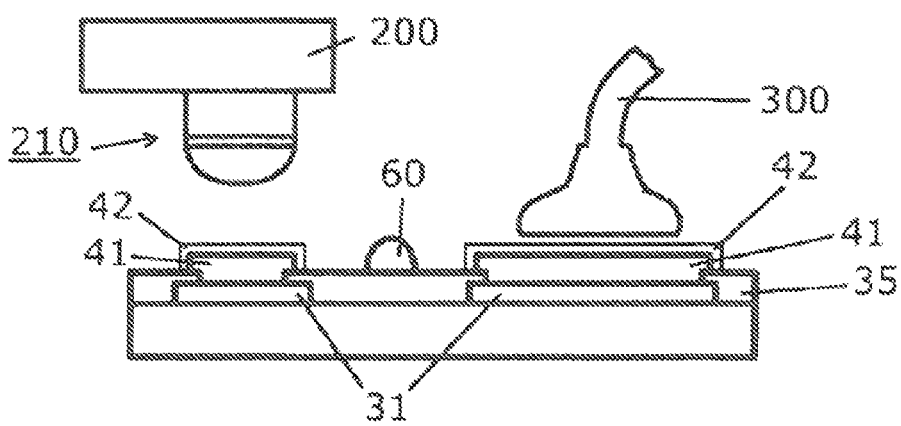

FIG. 4A and FIG. 4B show corresponding view as FIGS. 3A and 3B. FIG. 4C shows the same cross section part of FIG. 4B after an electroless plating process. In the electroless plating process a first lower Ni-based layer 41 and a second upper Au-based layer 42 are deposited onto the BEOL pad layer 31. In this case a special seed layer such as layer 32 and resist layer 37 in the galvanic plating process of FIG. 3C-H is not needed. The first Ni-based layer 41 may comprise a certain amount of P as, for example, between 4% and 12%. Optionally, a third Pd-based layer can be deposited so that it is disposed between the first and second layers 41 and 42. FIG. 4D shows the same after applying a dam 60 in the form of an elongated polymer layer. The dam 60 may be e.g. dispensed, printed by screen printing, jetting or any other technology, and cured afterwards. The dam 60 may have a form such as that shown with reference sign 54 in FIG. 2. Afterwards, a final visual inspection can be done.

FIG. 4E again shows a possible application in which the left-sided layer stack of group 52 may be connected to an electrical contact element 210 of an upper semiconductor device 200 and the right-sided larger layer stack of group 53 may be connected to a wire bond 300, e.g. Cu-, Au-, or Al-wire. The cross section of the layer differs marginal from the FIG. 1B. The layer 22 with the thickness A covers also the side wall (dimension B) of the layer 21. The shape of the top layer stack 20 may resemble a mushroom shape. It may further be possible to apply in e.g. BEOL area an additional suitable pad like metal structure in the area of dam 54 so that this dam structure can be plated using the process depicted in FIG. 4 resulting in analogy to FIG. 3.

Referring to FIG. 5A, there is shown a schematic cross-sectional side view representation to illustrate a total assembly of a semiconductor device 10, a substrate 100, and a further semiconductor device 200. The substrate 100 can be one or more of a printed circuit board (PCB), a laminate, a ceramic plate, a leadframe, a package surface, a (Si) interposer, a functionalized chip etc. At the lower surface of the substrate 100 interconnects 110 are attached in order to make contact to the next level assembly, wherein the interconnects 110 can be one or more of balls, leads, wires, press-fits, male/female connectors etc. The further semiconductor device 200 can have at its lower surface electrical contact elements 210 which are intended to make electrical contact with relevant electrical contact pads 2A of the semiconductor device 10. The assembly further comprises a bond wire 300 which makes electrical contact between an electrical contact pad 2B and the substrate 100. The bond wire can be based on one of the materials Cu, Au, Ag, Al. Pad 2C is mainly depicted for illustration and might have optional no such top layer stack.

FIG. 5B shows a schematic cross-sectional side view representation of an enlarged section of FIG. 5A. The enlarged section shows an electrical contact element 210 of the further semiconductor device 200, wherein the electrical contact element 210 mainly comprises a Cu-based pillar 211 covered by a SnAg-based layer 212. Between the Cu-based pillar and solder cap an additional e.g. Ni might be applied. With such an arrangement a solder connection can be fabricated with the electrical contact pads 2A of the semiconductor device 10.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

The invention claimed is:

1. A semiconductor device, comprising:
a semiconductor chip; and
a plurality of electrical contact pads disposed on a main face of the semiconductor chip, wherein
the electrical contact pads comprise a top layer stack, each top layer stack in the plurality comprising a plurality of layers arranged in the same order, and wherein
the electrical contact pads are both solderable and wire bondable,
wherein a first group of the electrical contact pads has first lateral dimensions and a second group of electrical contact pads has second lateral dimensions,
wherein the first lateral dimensions are smaller than the second lateral dimensions,
wherein the first group of the electrical contact pads is disposed at a center of the semiconductor chip, and
wherein the second group of the electrical contact pads forms a ring disposed at a periphery of the semiconductor chip that encloses the first group of the electrical contact pads.

2. The semiconductor device according to claim 1, wherein
each layer stack comprises a first lower Ni-based layer; and
a second upper Au-based layer;
wherein an upper surface of the second layer is connectable to a further semiconductor device or a bond wire.

3. The semiconductor device according to claim 2, wherein
each layer stack further comprises a third Pd-based layer disposed between the first and second layers.

4. The semiconductor device according to claim 2, wherein
the first lower Ni-based layer contains P.

5. The semiconductor device according to claim 4, wherein
the amount of P is in a range from greater than 4% to less than or equal to 12%.

6. The semiconductor device according to claim 1, further comprising:
a dam disposed on the main face between the first and second groups of the electrical contact pads and being formed in a ring that surrounds the first group of the electrical contact pads.

7. The semiconductor device according to claim 6, wherein
the dam is formed either of one or more of the materials of the layer stacks or of a polymer material.

8. The semiconductor device according to claim 6, wherein the dam is formed of one or more of the materials of the layer stacks.

9. The semiconductor device according to claim 6, wherein the dam is disposed on an exposed portion of the main face of the semiconductor chip that extends between the first and second groups of the electrical contact pads, and wherein the dam provides a vertical protrusion extending away from the exposed portion of the main face of the semiconductor chip so as to prevent liquefied material from flowing between the first and second groups of the electrical contact pads.

10. A semiconductor device, comprising:
a semiconductor chip; and
a plurality of electrical contact pads disposed on a main face of the semiconductor chip, wherein
the electrical contact pads or one or more groups of the electrical contact pads comprise a layer stack, each layer stack comprising
a first lower Ni-based layer, and
a second upper Au-based layer,
wherein an upper surface of the second layer is connectable to a further semiconductor device or a bond wire,
wherein a first group of the electrical contact pads has first lateral dimensions and a second group of electrical contact pads has second lateral dimensions,
wherein the first lateral dimensions are smaller than the second lateral dimensions,
wherein the first group of the electrical contact pads is disposed at a center of the semiconductor chip, and
wherein the second group of the of the electrical contact pads forms a ring disposed at a periphery of the semiconductor chip that encloses the first group of the electrical contact pads.

11. The semiconductor device according to claim 10, further comprising:
a third Pd-based layer disposed between the first and second layers.

12. The semiconductor device according to claim 10, wherein
the first lower Ni-based layer contains P.

13. The semiconductor device according to claim 12, wherein
the amount of P is in a range from greater than 0% to less or equal than 12%.

14. The semiconductor device according to claim 10, further comprising:
a dam disposed on the main face between the first and second groups of the electrical contact pads and being formed in a ring that surrounds the first group of the electrical contact pads.

15. The semiconductor device according to claim 14, wherein the dam is disposed on an exposed portion of the main face of the semiconductor chip that extends between the first and second groups of the electrical contact pads, and wherein the dam provides a vertical protrusion extending away from the exposed portion of the main face of the semiconductor chip so as to prevent liquefied material from flowing between the first and second groups of the electrical contact pads.

16. The semiconductor device according to claim 10, further comprising:
a further semiconductor chip comprising electrical contact elements and being disposed above the semiconductor chip, wherein the electrical contact elements are connected with a group of the plurality of electrical contact pads.

17. A method for fabricating a semiconductor device, comprising:
providing a semiconductor die;
fabricating a plurality of electrical contact pads on a main face of the semiconductor die, wherein
the electrical contact pads comprise a layer stack, each layer stack comprising a plurality of layers arranged in the same order; and wherein
the electrical contact pads are both solderable and wire bondable,
wherein a first group of the electrical contact pads has first lateral dimensions and a second group of electrical contact pads has second lateral dimensions,
wherein the first lateral dimensions are smaller than the second lateral dimensions,
wherein the first group of the electrical contact pads is disposed at a center of the semiconductor die, and
wherein the second group of the of the electrical contact pads forms a ring disposed at a periphery of the semiconductor die that encloses the first group of the electrical contact pads.

18. The method according to claim 17, wherein
fabricating the plurality of electrical contact pads comprises either one of galvanical plating or electroless plating.

19. The method according to claim 17, wherein
fabricating the plurality of electrical contact pads comprises depositing a first Ni-based layer onto electrical contact elements on the main face of the semiconductor chip; and
depositing a second Au-based layer above the first Ni-based layer such that an upper surface of the second layer is connectable to a further semiconductor device or a bond wire.

20. The method according to claim 19, wherein
fabricating the plurality of electrical contact pads further comprises depositing a Pd based layer between the Ni- and Au-based layer.

* * * * *

UNITED STATES PATENT AND TRADEMARK OFFICE
CERTIFICATE OF CORRECTION

PATENT NO. : 9,496,237 B2
APPLICATION NO. : 14/715778
DATED : November 15, 2016
INVENTOR(S) : G. Beer et al.

It is certified that error appears in the above-identified patent and that said Letters Patent is hereby corrected as shown below:

In the Claims

At Column 12, Line 3 (Claim 17, Line 18), please delete "of the" before electrical.

Signed and Sealed this
Twenty-first Day of February, 2017

Michelle K. Lee
*Director of the United States Patent and Trademark Office*